United States Patent
Peng et al.

(10) Patent No.: US 10,325,994 B2
(45) Date of Patent: Jun. 18, 2019

(54) SEMICONDUCTOR DEVICE AND METHOD OF FORMING VERTICAL STRUCTURE

(71) Applicant: TAIWAN SEMICONDUCTOR MANUFACTURING CO., LTD., Hsinchu (TW)

(72) Inventors: Chih-Tang Peng, Hsinchu County (TW); Tai-Chun Huang, Hsinchu (TW); Teng-Chun Tsai, Hsinchu (TW); Cheng-Tung Lin, Hsinchu County (TW); De-Fang Chen, Hsinchu (TW); Li-Ting Wang, Hsinchu (TW); Chien-Hsun Wang, Hsinchu (TW); Huan-Just Lin, Hsinchu (TW); Yung-Cheng Lu, Hsinchu (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/959,900

(22) Filed: Apr. 23, 2018

(65) Prior Publication Data
US 2018/0240882 A1 Aug. 23, 2018

Related U.S. Application Data

(60) Continuation of application No. 15/084,607, filed on Mar. 30, 2016, now Pat. No. 9,954,069, which is a
(Continued)

(51) Int. Cl.
*H01L 29/423* (2006.01)
*H01L 29/66* (2006.01)
(Continued)

(52) U.S. Cl.
CPC ........ *H01L 29/42392* (2013.01); *B82Y 10/00* (2013.01); *B82Y 40/00* (2013.01);
(Continued)

(58) Field of Classification Search
CPC ......... H01L 29/42392; H01L 29/66666; H01L 29/7889; H01L 29/775; H01L 29/0676; H01L 29/7827; H01L 29/66439
See application file for complete search history.

(56) References Cited

U.S. PATENT DOCUMENTS

| | | | |
|---|---|---|---|
| 5,294,814 A | 3/1994 | Das | |
| 6,080,683 A * | 6/2000 | Faur | H01L 21/02126 257/E21.288 |

(Continued)

FOREIGN PATENT DOCUMENTS

| | | |
|---|---|---|
| JP | 2005-012214 A | 1/2015 |
| KR | 20120139067 A | 12/2012 |

OTHER PUBLICATIONS

Office Action issued in corresponding Chinese Patent Application No. 201410804259.1, dated Aug. 28, 2017.
(Continued)

*Primary Examiner* — Joseph C. Nicely
(74) *Attorney, Agent, or Firm* — McDermott Will & Emery LLP

(57) ABSTRACT

According to an exemplary embodiment, a method of forming a vertical structure with at least two barrier layers is provided. The method includes the following operations: providing a substrate; providing a vertical structure over the substrate; providing a first barrier layer over a source, a channel, and a drain of the vertical structure; and providing a second barrier layer over a gate and the drain of the vertical structure.

20 Claims, 29 Drawing Sheets

Related U.S. Application Data division of application No. 14/334,724, filed on Jul. 18, 2014, now Pat. No. 9,318,447.

(51) Int. Cl.

| | | |
|---|---|---|
| *H01L 29/788* | (2006.01) | |
| *H01L 21/02* | (2006.01) | |
| *H01L 23/00* | (2006.01) | |
| *H01L 29/78* | (2006.01) | |
| *B82Y 10/00* | (2011.01) | |
| *B82Y 40/00* | (2011.01) | |
| *H01L 29/775* | (2006.01) | |
| *H01L 29/06* | (2006.01) | |
| *H01L 23/29* | (2006.01) | |
| *H01L 23/31* | (2006.01) | |
| *H01L 27/088* | (2006.01) | |

(52) U.S. Cl.
CPC .... *H01L 21/0217* (2013.01); *H01L 21/02126* (2013.01); *H01L 21/02167* (2013.01); *H01L 23/291* (2013.01); *H01L 23/3171* (2013.01); *H01L 23/564* (2013.01); *H01L 27/088* (2013.01); *H01L 29/0676* (2013.01); *H01L 29/42356* (2013.01); *H01L 29/66439* (2013.01); *H01L 29/66666* (2013.01); *H01L 29/775* (2013.01); *H01L 29/7827* (2013.01); *H01L 29/7889* (2013.01); *H01L 2924/0002* (2013.01)

(56) References Cited

U.S. PATENT DOCUMENTS

| | | | |
|---|---|---|---|
| 6,238,976 B1 | 5/2001 | Noble et al. | |
| 6,642,575 B1 | 11/2003 | Ono et al. | |
| 8,802,551 B1 | 8/2014 | Seo et al. | |
| 9,728,466 B1* | 8/2017 | Mallela | H01L 21/823814 |
| 2008/0217711 A1 | 9/2008 | Sugiyama et al. | |
| 2009/0008631 A1 | 1/2009 | Hurkx et al. | |
| 2009/0078993 A1 | 3/2009 | Fujimoto | |
| 2009/0200604 A1* | 8/2009 | Chidambarrao | H01L 29/66787 257/329 |
| 2010/0219482 A1 | 9/2010 | Masuoka et al. | |
| 2010/0330759 A1 | 12/2010 | Forbes | |
| 2011/0303973 A1 | 12/2011 | Masuoka et al. | |
| 2013/0093000 A1 | 4/2013 | Guo et al. | |
| 2013/0095623 A1 | 4/2013 | Guo et al. | |
| 2013/0307057 A1 | 11/2013 | Masuoka et al. | |
| 2014/0061775 A1 | 3/2014 | Chuang et al. | |
| 2014/0091385 A1 | 4/2014 | Masuoka et al. | |
| 2014/0097494 A1* | 4/2014 | Masuoka | H01L 29/66795 257/365 |
| 2014/0166981 A1 | 6/2014 | Doyle et al. | |
| 2014/0170821 A1 | 6/2014 | Nyhus et al. | |
| 2014/0183725 A1* | 7/2014 | Lin | H01L 23/3114 257/737 |
| 2014/0252619 A1* | 9/2014 | Lin | H01L 21/76832 257/751 |
| 2015/0228718 A1 | 8/2015 | Lin et al. | |
| 2015/0303202 A1 | 10/2015 | Sun et al. | |
| 2015/0303296 A1* | 10/2015 | Masuoka | H01L 29/66666 257/401 |
| 2015/0333152 A1* | 11/2015 | Lin | H01L 29/1037 257/329 |
| 2015/0348977 A1 | 12/2015 | Barth, Jr. et al. | |
| 2015/0357428 A1 | 12/2015 | Masuoka et al. | |
| 2015/0357432 A1* | 12/2015 | Lin | H01L 29/66439 257/24 |
| 2015/0364333 A1* | 12/2015 | Chen | H01L 21/3085 257/329 |
| 2015/0364358 A1* | 12/2015 | Tsai | H01L 21/762 438/400 |
| 2015/0372082 A1 | 12/2015 | Wu et al. | |
| 2015/0372083 A1 | 12/2015 | Tang et al. | |
| 2015/0372149 A1* | 12/2015 | Colinge | H01L 29/788 257/316 |
| 2015/0380505 A1* | 12/2015 | Masuoka | H01L 29/78 257/329 |
| 2015/0380548 A1 | 12/2015 | Wang et al. | |
| 2016/0020180 A1 | 1/2016 | Peng et al. | |
| 2016/0064541 A1 | 3/2016 | Diaz et al. | |
| 2016/0247938 A1* | 8/2016 | Masuoka | H01L 29/7827 |
| 2016/0343847 A1* | 11/2016 | Masuoka | H01L 21/02532 |
| 2016/0343871 A1* | 11/2016 | Masuoka | H01L 29/78 |
| 2016/0343879 A1* | 11/2016 | Masuoka | H01L 29/78 |
| 2017/0092739 A1* | 3/2017 | Holland | H01L 21/02546 |
| 2017/0125344 A1* | 5/2017 | Masuoka | H01L 23/5228 |
| 2017/0148899 A1 | 5/2017 | Ohtou et al. | |
| 2017/0309707 A1 | 10/2017 | Tang et al. | |

OTHER PUBLICATIONS

Korean Office Action in corresponding Korean Patent Application No. 10-2014-0181818, dated Dec. 7, 2015.
Taiwanese Office Action in corresponding Taiwanese Patent Application No. 104112171, dated May 9, 2016.
Office Action issued in corresponding U.S. Appl. No. 15/084,607, dated Aug. 15, 2017.
Office Action issued in corresponding U.S. Appl. No. 15/084,607, dated Jul. 5, 2016.
Notice of Allowance issued in corresponding U.S. Appl. No. 15/084,607, dated Dec. 22, 2017.

\* cited by examiner

US 10,325,994 B2

SEMICONDUCTOR DEVICE AND METHOD OF FORMING VERTICAL STRUCTURE

This application is a continuation of U.S. patent application Ser. No. 15/084,607, filed on Mar. 30, 2016, which is a divisional of U.S. patent application Ser. No. 14/334,724, filed Jul. 18, 2014, now U.S. Pat. No. 9,318,447, issued on Apr. 19, 2016, which are incorporated herein by references in its entirety.

BACKGROUND

Vertical semiconductor devices, such as vertical gate-all-around transistors, are an emerging research area in the semiconductor industry. However, the process integration for the device is always a challenge because essentials of the device are vulnerable to oxidation. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
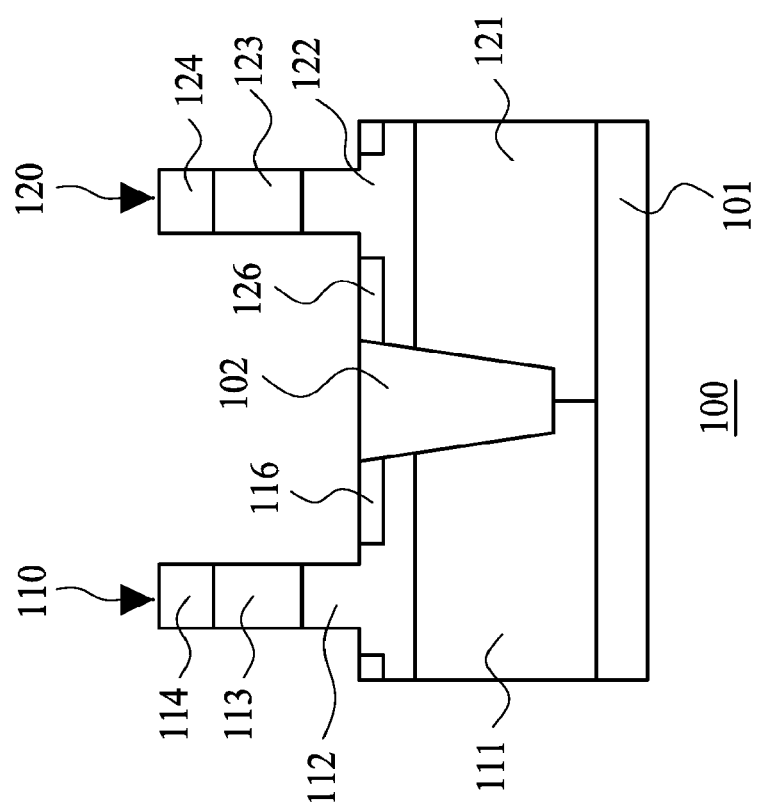
FIGS. 1-14, 4a, 4b, 11a are sectional views illustrating an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure provides a novel vertical structure having multiple barrier layers, which can be applied to vertical gate-all-around (VGAA) devices. The material of the barrier layers can be SiN, SiCN, or SiCON. The barrier layers isolate a source, a drain, a gate including high-K layer and a metal gate from oxidation by other processes. Therefore, the vertical structure having the barrier layers may decrease: nanowire oxidation caused by changing critical dimension of the nanowire; source/drain oxidation; high-K dielectrics oxidation caused by changing equivalent oxide thickness (EOT); and metal gate oxidation, due to annealing processes. Additionally, the barrier layers can be used as a hard mask during contact etching processes to form self-aligned contacts.

The vertical structure may be configured as follows: the substrate material may be Si, SiGe, Ge, or III/V Epi (InP, GaAs, AlAs, InAs, InAlAs, InGaAs, InSb, GaSb, InAlSb, InGaSb); the nanowire material may be Si, SiGe, Ge, or III/V Epi (InP, GaAs, AlAs, InAs, InAlAs, InGaAs, InSb, GaSb, InAlSb, InGaSb); the substrate material can be same or different with the nanowire material; the high-K dielectrics may be a single layer or multiple layers structure with $HfO_2$, $ZrO_2$, $HfZrO_2$, $Ga_2O_3$, $Gd_2O_3$, $TaSiO_2$, $Al2O_3$, or $TiO_2$; the work function metal (WFM) for PMOS vertical structures may be TiN, W, WN, Mo, or MoN; the WFM for NMOS vertical structures may be TiAl, TiAlC, or TaAlC; the metal gate (MG) material may be Al, W, Co, or Cu; the barrier layer material may be SiN, SiON, SiC, SiCN, SiCO, or SiCON; SAC metal material may be Al, W, Co, or Cu; Back-end-of-line (BEOL) metal material may be Al, W, Co, or Cu.

Additionally, the drain may refer to a region that has been treated as a drain, or a region that has not been treated but to be treated as a drain. The source may refer to a region that has been treated as a source, or a region that has not been treated but to be treated as a source. The channel may refer to a region that has been treated as a channel, or a region that has not been treated but to be treated as a channel.

FIG. 1 is a sectional view illustrating an exemplary semiconductor device in accordance with some embodiments. As shown in FIG. 1, a semiconductor device 100 is provided. In the semiconductor device 100, a first vertical structure 110, and a second vertical structure 120 are provided over a substrate 101. The first vertical structure 110 and the second vertical structure 120 may be vertical-gate-all-around devices electrically isolated by shallow trench isolation 102. The first vertical structure 110 may be a PMOS, and may include an n-well 111, a first source 112, a first channel 113, and a first drain 114. The second vertical structure 120 may be an NMOS, and may include a p-well 121, a second source 122, a second channel 123, and a second drain 124. Silicides 116, 126 are used to reduce contact resistance.

The first source 112 is disposed over the n-well 111. The first channel 113 is disposed over the first source 112. The first drain 114 is disposed over the first channel 113. The second source 122 is disposed over the p-well 121. The second channel 123 is disposed over the second source 122. The second drain 124 is disposed over the second channel 123. The following procedures may be performed on the first vertical structure 110 and the second vertical structure 120, so will only be discussed below with respect to the first vertical structure 110.

In one embodiment, the substrate 101 includes a crystalline silicon substrate. In some alternative embodiments, the substrate 101 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 101 may include an epitaxial layer (epi-layer), may be strained for performance enhancement, and/or may include a silicon-on-insulator (SOI) structure.

Figure 2:
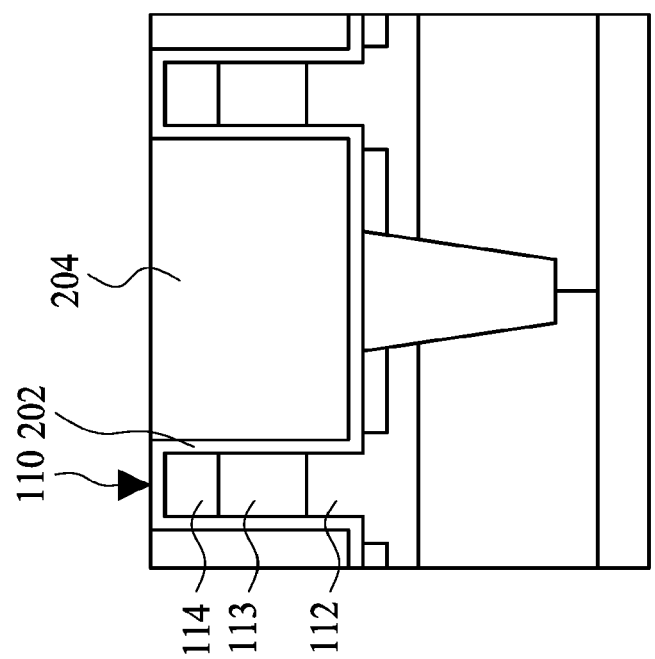

FIG. 2 is a sectional view illustrating the exemplary semiconductor device in accordance with some embodiments. As shown in FIG. 2, a first barrier layer 202 is formed over the source 112, the channel 113, and the drain 114 of the first vertical structure 110 to protect them from oxidation. The first barrier layer 202 may be formed of SiN, SiON, SiC, SiCN, SiCO, or SiCON. The first barrier layer 202 may have a thickness of, for example, about 30 to about 60 angstroms. In the embodiment, the first barrier layer 202 is formed in contact with the source 112, the channel 113, and the drain 114; in some embodiment, there are other layers therebetween so that the first barrier layer 202 is formed not in contact with but adjacent to them.

A first interlayer dielectric 204 (e.g., an oxide layer) is formed over the first barrier layer 202. To enhance quality of the first interlayer dielectric 204, oxidation processes may be applied to the first interlayer dielectric 204. In some embodiments, the enhancement is included in the formation of the first interlayer dielectric 204. The source 112, the channel 113, and the drain 114 of the first vertical structure 110 are covered by the first barrier layer 202, so that the oxidation processes for the enhancement does not damage or oxidize the first vertical structure 110. A chemical mechanical polishing is performed on the first interlayer dielectric 204 and stops on the first barrier layer 202. The protection that the first barrier layer 202 provides is not limited to the above oxidation and can be any that is likely to oxidize the first vertical structure 110.

Figure 3:
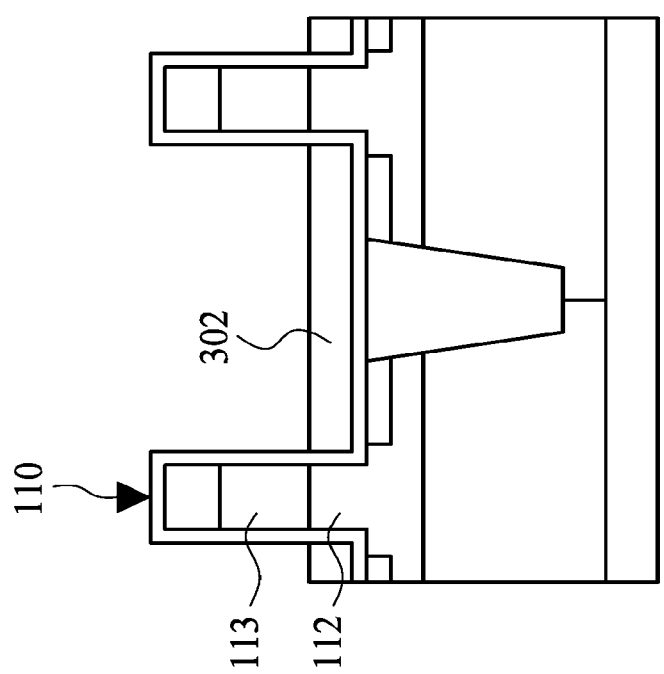

FIG. 3 is a sectional view illustrating the exemplary semiconductor device in accordance with some embodiments. As shown in FIG. 3, the first interlayer dielectric 204 is etched back to form a bottom isolation layer 302 corresponding to the source 112 of the first vertical structure 110 by using wet etching or plasma etching. In the embodiment, the bottom isolation layer 302 is aligned with a top surface of the source 112 in conjunction with the channel 113.

Figure 4:
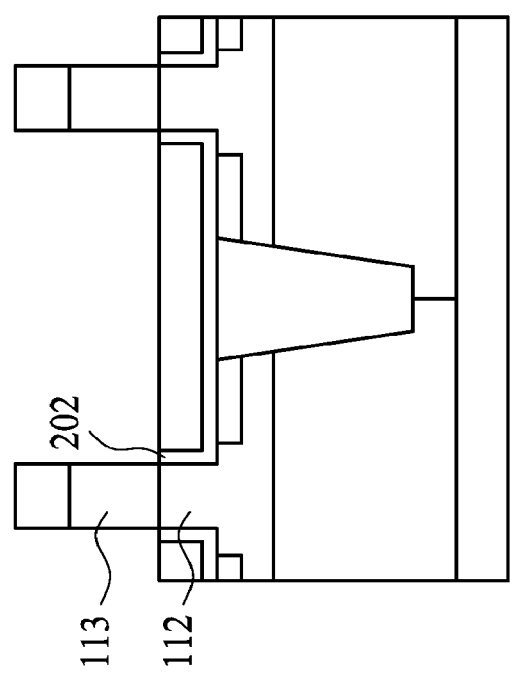

FIG. 4 is a sectional view illustrating the exemplary semiconductor device in accordance with some embodiments. As shown in FIG. 4, the first barrier layer 202 is etched back, by using wet etching or plasma etching, and corresponds to the source 112. In details, the first barrier layer 202 is aligned with the top surface of the source 112 in conjunction with the channel 113.

Figure 4A:
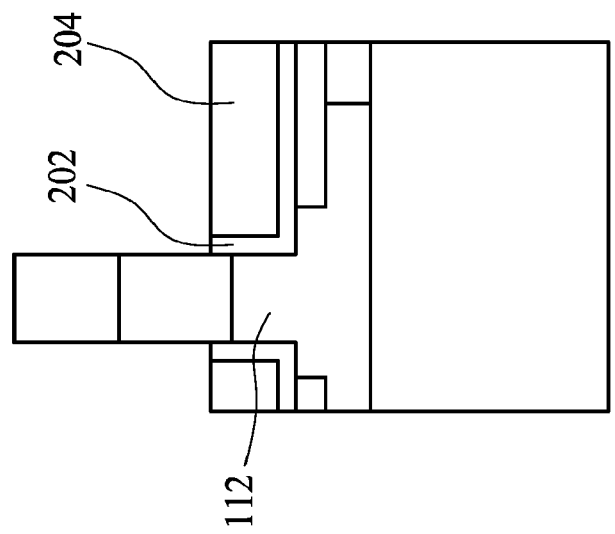

FIG. 4a is a sectional view illustrating a detailed diagram of the left portion of the exemplary semiconductor device in accordance with some embodiments. As shown in FIG. 4a, the first interlayer dielectric 204 and the first layer 202 are well-controlled to etched back by using wet etching or plasma etching. In the embodiment, the first interlayer dielectric 204 is higher than a top surface of the source 112 about 0 to about 10 nanometers. The method will provide a device operating in an accumulation mode.

Figure 4B:
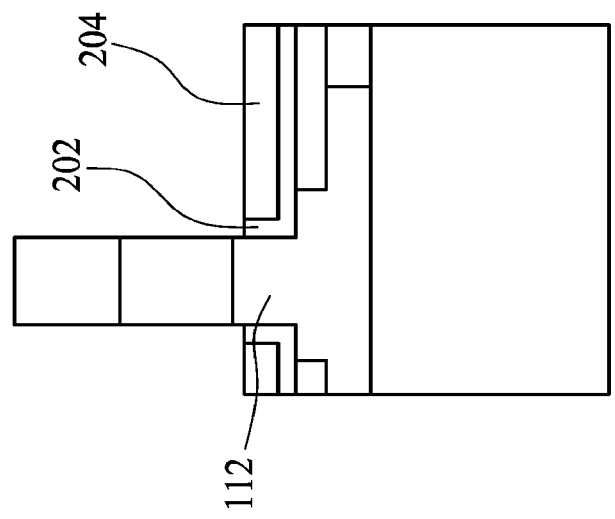

FIG. 4b is a sectional view illustrating another detailed diagram of the left portion of the exemplary semiconductor device in accordance with some embodiments. As shown in FIG. 4b, the first interlayer dielectric 204 and the first layer 202 are well-controlled to etched back by using wet etching or plasma etching. In the embodiment, the first interlayer dielectric 204 is lower than a top surface of the source 112 about 0 to about 10 nanometers. The method will provide a device operating in an inversion mode.

Figure 5:
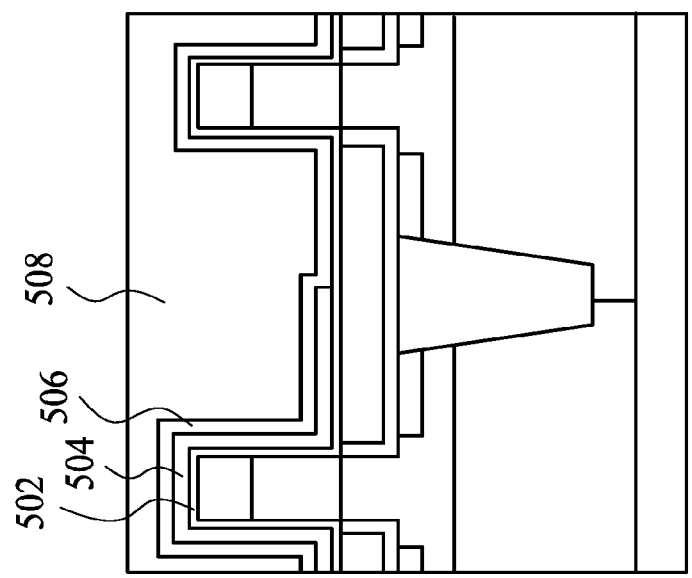

FIG. 5 is a sectional view illustrating the exemplary semiconductor device in accordance with some embodiments. Continuing from FIG. 4, as shown in FIG. 5, a high-k dielectric layer 502, work function metal (WFM) layers 504, 506, and a metal gate 508 are formed over the first vertical structure 110. The high-K dielectric material may be a single layer or multiple layers structure with $HfO_2$, $ZrO_2$, $HfZrO_2$, $Ga_2O_3$, $Gd_2O_3$, $TaSiO_2$, $Al2O3$, or $TiO_2$. The work function metal (WFM) may be TiN, W, WN, Mo, MoN, TiAl, TiAlC, or TaAlC. The metal gate material may be Al, W, Co, or Cu.

Figure 6:
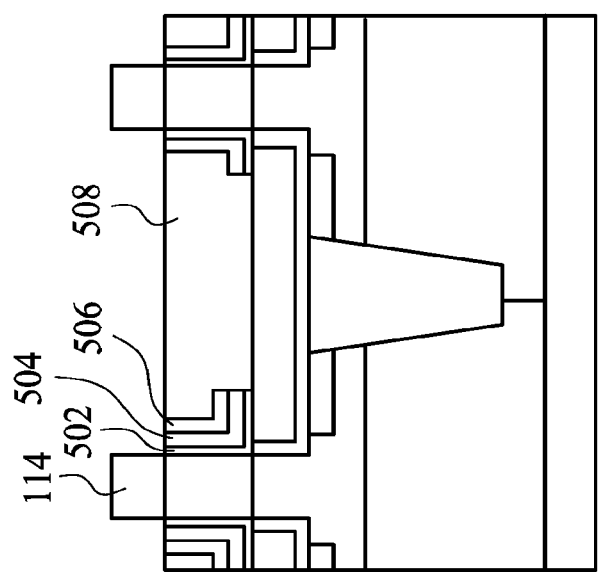

FIG. 6 is a sectional view illustrating the exemplary semiconductor device in accordance with some embodiments. As shown in FIG. 6, the high-k dielectric layer 502, the work function metal (WFM) layers 504, 506, and the metal gate 508 are etched back to expose the drain 114.

Figure 7:
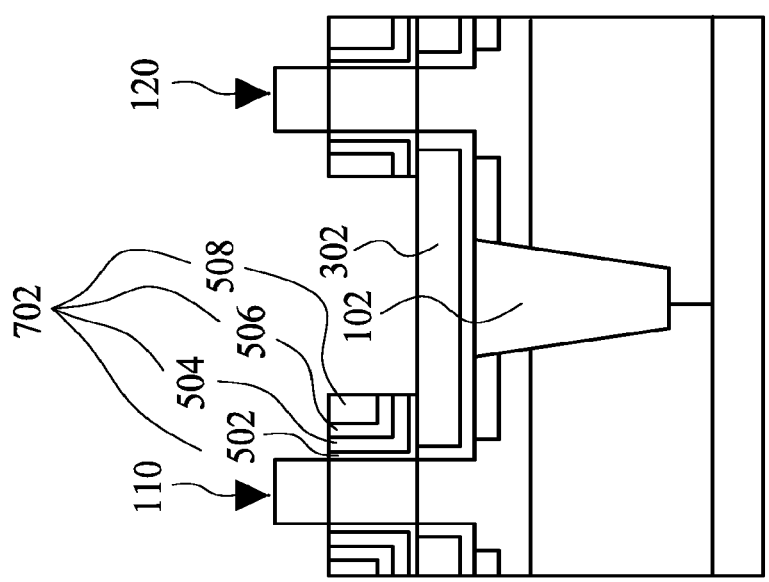

FIG. 7 is a sectional view illustrating the exemplary semiconductor device in accordance with some embodiments. As shown in FIG. 7, a portion of the high-k dielectric layer 502, the work function metal (WFM) layers 504, 506, and the metal gate 508 above the STI 102 between the first vertical structure 110 and the second vertical structure 120 are etched back, and the etch-back stops on the bottom isolation layer 302. A gate 702 is formed and includes the high-k dielectric layer 502, the work function metal (WFM) layers 504, 506, and the metal gate 508.

Figure 8:
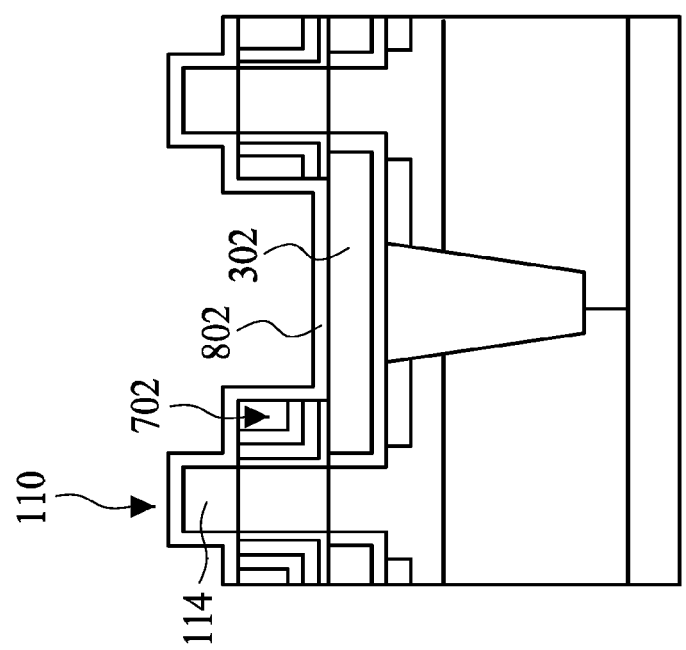

FIG. 8 is a sectional view illustrating the exemplary semiconductor device in accordance with some embodiments. As shown in FIG. 8, a second barrier layer 802 is formed over the gate 702 and the drain 114 of the first vertical structure 110, and the bottom isolation layer 302 so as to protect the gate 702 and the drain 114 from oxidation. In details, the second barrier layer 802 is formed in contact with a top and a sidewall of the gate 702, and a top and a sidewall the drain 114 as well.

The second barrier layer 802 may be formed of SiN, SiON, SiC, SiCN, SiCO, or SiCON. The second barrier layer 802 may have a thickness of, for example, about 30 to about 60 angstroms. In the embodiment, the second barrier layer 802 is formed in contact with the gate 702 and the drain 114; in some embodiment, there are other layers therebetween so that the second barrier layer 802 is formed not in contact with but adjacent to them.

Figure 9:
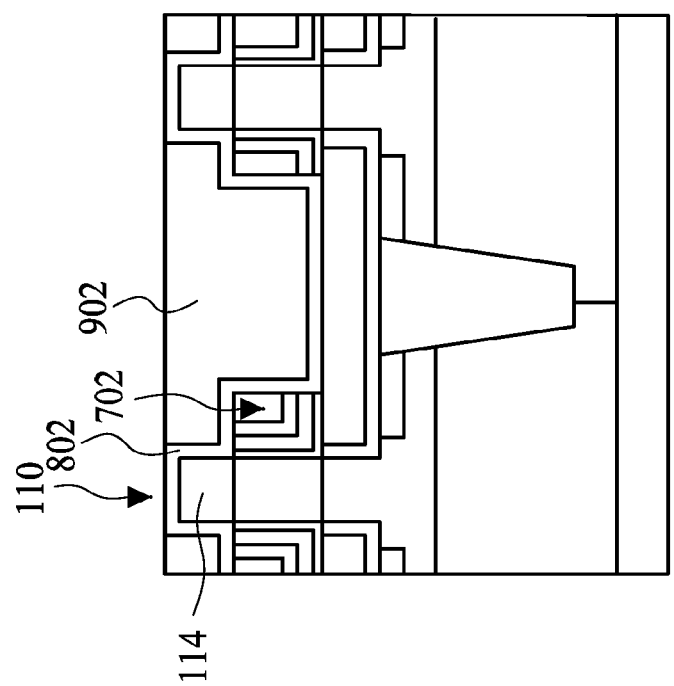

FIG. 9 is a sectional view illustrating the exemplary semiconductor device in accordance with some embodiments. As shown in FIG. 9, a second interlayer dielectric 902 (e.g., an oxide layer) is formed over the second barrier layer 802. In some embodiments, the enhancement is included in the formation of the second interlayer dielectric 902. To enhance quality of the second interlayer dielectric 902, oxidation processes may be applied to the second interlayer dielectric 902. The gate 702 and the drain 114 of the first vertical structure 110 are covered by the second barrier layer 802 so that the oxidation processes for the enhancement does not damage or oxidize the first vertical structure 110. Furthermore, a chemical mechanical polishing is performed on the second interlayer dielectric 902 and stops on the second barrier layer 802. The protection that the second barrier layer 802 provides is not limited to the above oxidation and can be any that is likely to oxidize the first vertical structure 110.

Figure 10:
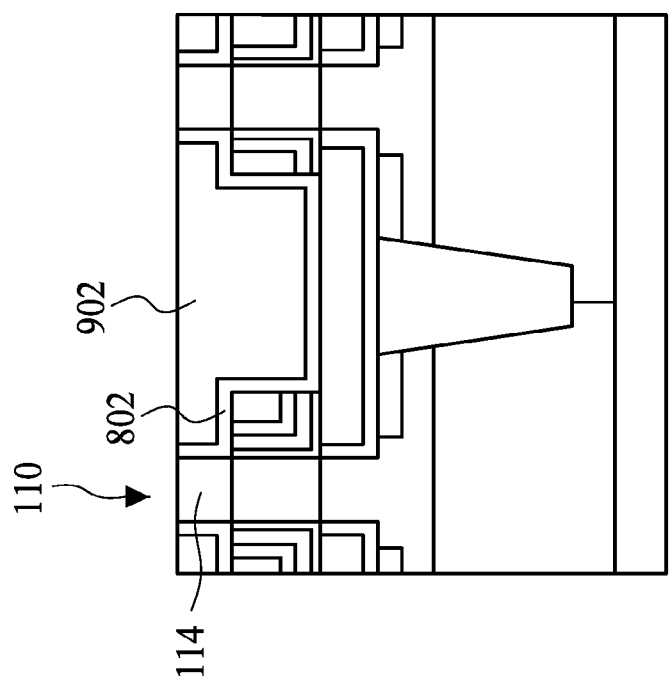

FIG. 10 is a sectional view illustrating the exemplary semiconductor device in accordance with some embodiments. As shown in FIG. 10, the second interlayer dielectric 902 and the second barrier layer 802 are etched back to expose a top of the drain 114 of the first vertical structure 110 by using wet etching or plasma etching.

Figure 11:
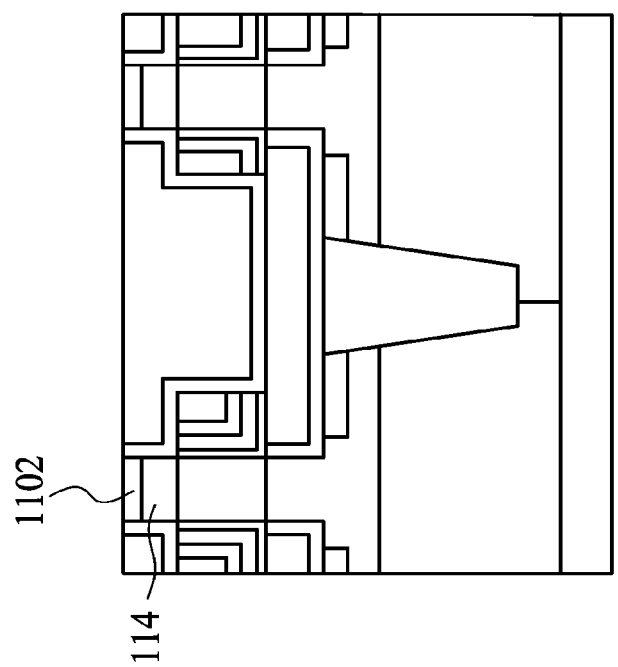

FIG. 11 is a sectional view illustrating the exemplary semiconductor device in accordance with some embodiments. As shown in FIG. 11, a metal is deposited on the drain 114, and annealing is performed on the metal to form a silicide 1102.

Figure 11A:
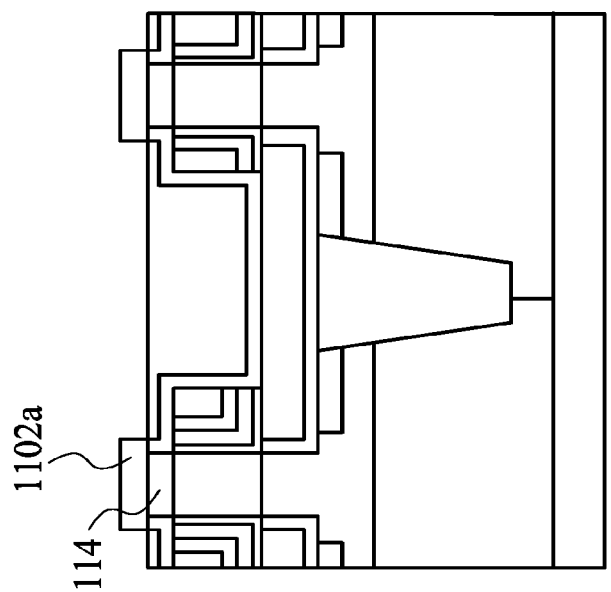

FIG. 11a is a sectional view illustrating the exemplary semiconductor device in accordance with some embodiments. Continuing from FIG. 9, as shown in FIG. 11a the second interlayer dielectric 902 and the second barrier layer 802 are etched back to expose not only a top of the drain 114 but also a portion of a sidewall of the drain 114 by using wet etching or plasma etching. Moreover, a metal is deposited the top and the sidewall of the drain 114, and annealing is performed on the metal to form a silicide 1102a having a greater width than the silicide 1102 in FIG. 11.

Figure 12:
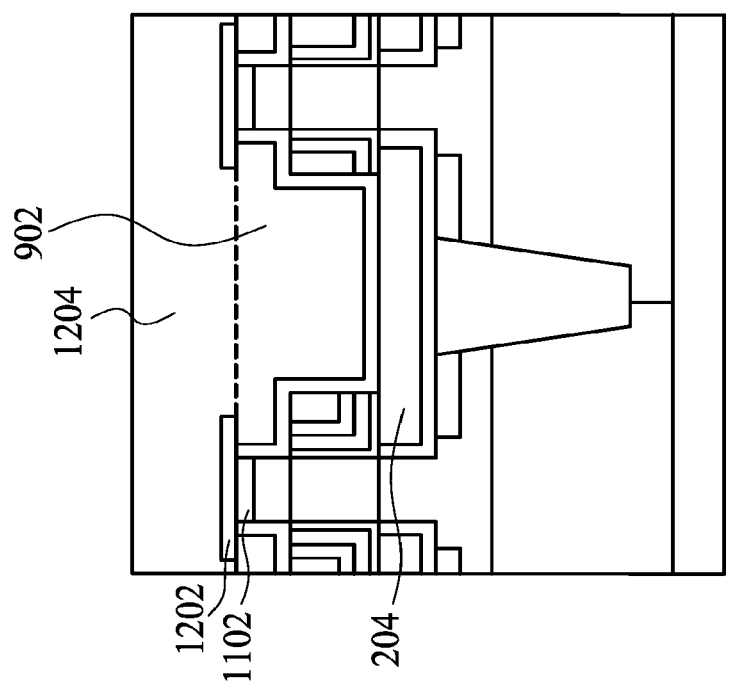

FIG. 12 is a sectional view illustrating the exemplary semiconductor device in accordance with some embodiments. Continuing from FIG. 11, as shown in FIG. 12, a pad 1202 is formed on the silicide 1102. A third interlayer dielectric 1204 (e.g., an oxide layer) is formed over the second interlayer dielectric 902 and the pad 1202.

Figure 13:
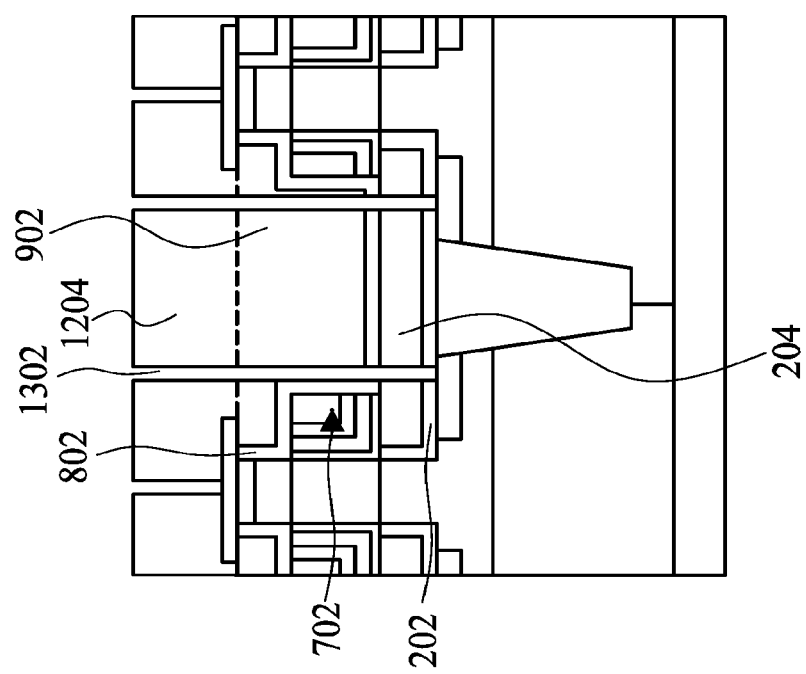

FIG. 13 is a sectional view illustrating the exemplary semiconductor device in accordance with some embodiments. As shown in FIG. 13, an opening 1302 is formed through the first barrier layer 202, the first interlayer dielectric 204, the second barrier layer 802, the second interlayer dielectric 902, and the third interlayer dielectric 1204. The formation of the opening 1302 may include: to etch the third interlayer dielectric 1204 and the second interlayer dielectric 902; to etch the second barrier layer 802; to etch the first interlayer dielectric 204; to etch the first barrier layer 202. The second barrier layers 802 can be used a hard mask during such formation of the opening 1302 to protect the gate 702 from unexpected damage.

Figure 14:
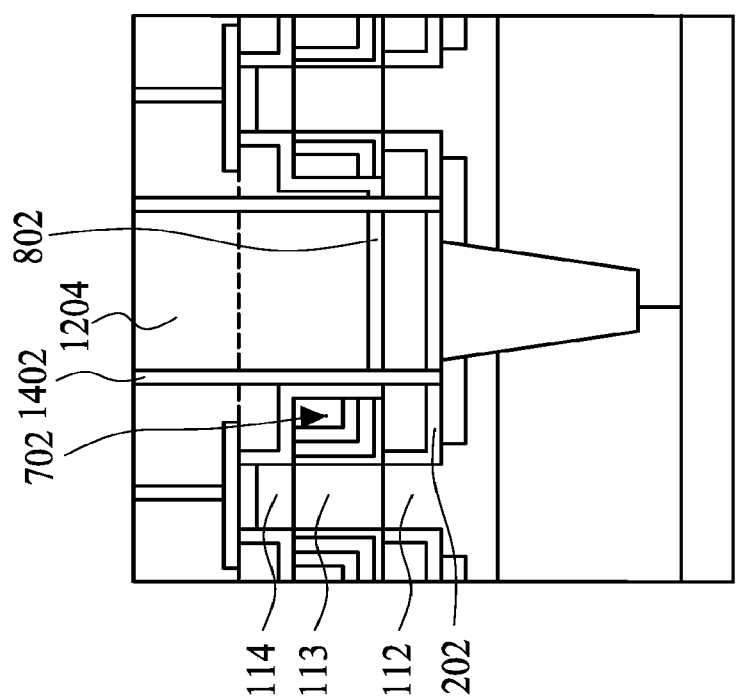

FIG. 14 is a sectional view illustrating the exemplary semiconductor device in accordance with some embodiments. As shown in FIG. 14, a contact metal 1402 is formed in the opening 1302. A chemical mechanical polishing is performed on the contact metal 1402 and stops on the third interlayer dielectric 1204.

In the abovementioned processes, the first barrier layer 202 protects the source 112, the channel 113, and the drain 114 of the first vertical structure 110 from the formation of the bottom isolation layer 302 which may damage or oxidize the first vertical structure 110. The second barrier layer 802 protects the gate 702 and the drain 114 from the formation of the second interlayer dielectric 902 which may damage or oxidize the first vertical structure 110.

The abovementioned disclosure shows one embodiment, and the following description disclosure will introduce another embodiment with other types of barrier layers.

Figure 15:
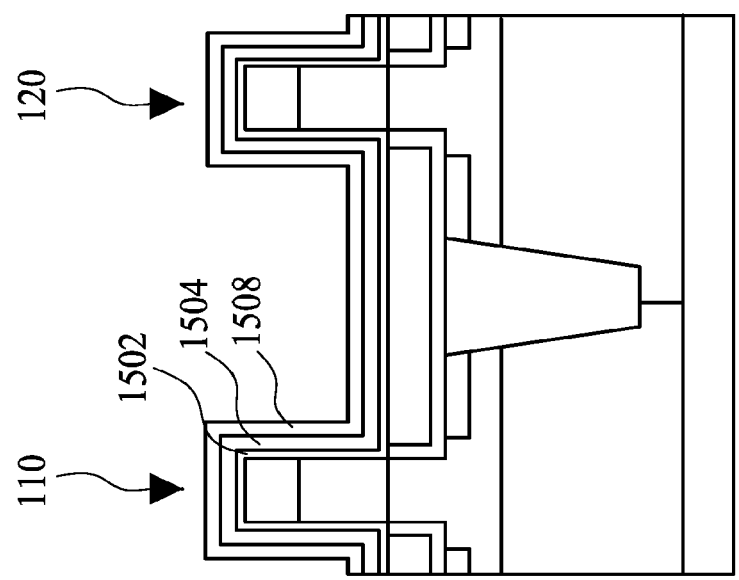
FIGS. 15-24 are sectional views illustrating another exemplary semiconductor device in accordance with some embodiments.

FIG. 15 is a sectional view illustrating the exemplary semiconductor device in accordance with some embodiments. Continuing from FIG. 4, as shown in FIG. 15, a high-k dielectric layer 1502, a work function metal (WFM) layers 1504, and a metal gate 1508 are formed over the first vertical structure 110. Compared to FIG. 5, the formation does not fill the recess between the first vertical structure 110 and the second vertical structure 120 with the metal gate 1508 but as a thin layer in FIG. 15.

Figure 16:
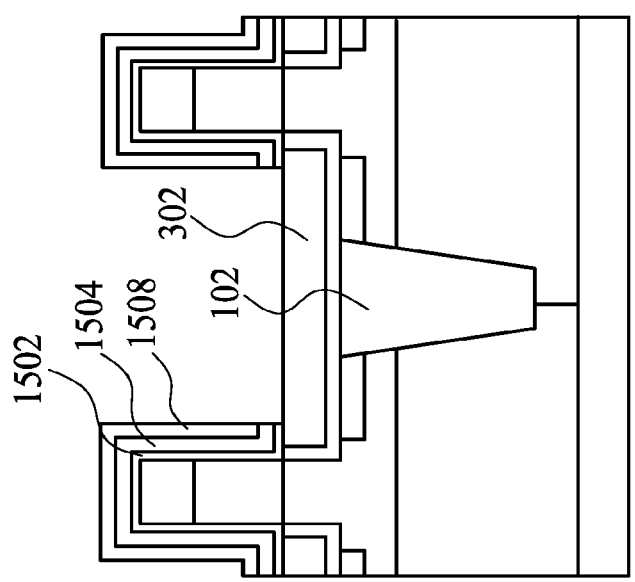

FIG. 16 is a sectional view illustrating the exemplary semiconductor device in accordance with some embodiments. As shown in FIG. 16, a portion of the high-k dielectric layer 1502, the work function metal (WFM) layer 1504, and the metal gate 1508 above the STI 102 between the first vertical structure 110 and the second vertical structure 120 are etched back, and the etch-back stops on the bottom isolation layer 302.

Figure 17:
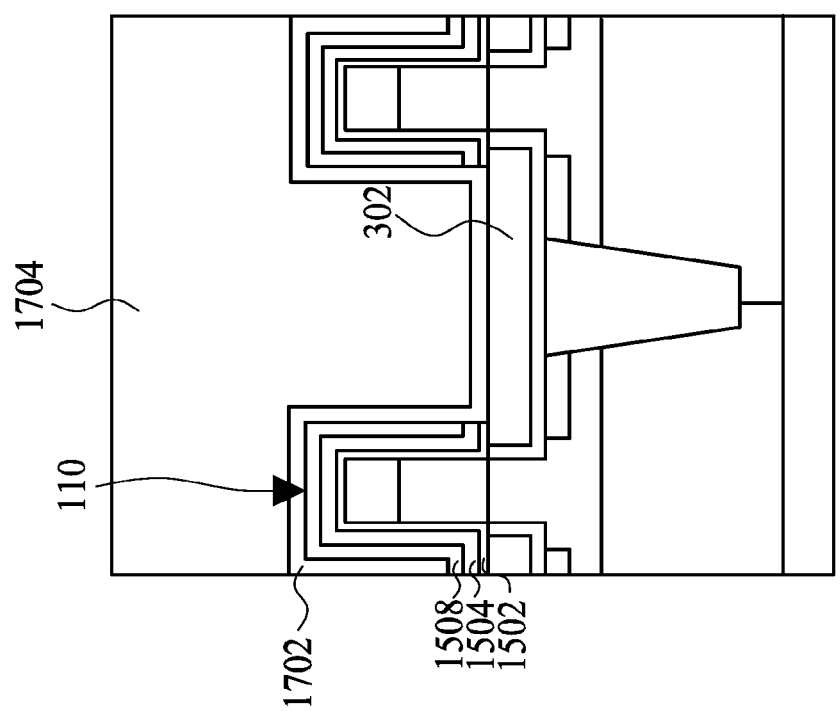

FIG. 17 is a sectional view illustrating the exemplary semiconductor device in accordance with some embodiments. As shown in FIG. 17, a second barrier layer 1702 is formed over the high-k dielectric layer 1502, the work function metal layer 1504, and the metal gate 1508 so as to protect them from oxidation. The second barrier layer 1702 may be formed of SiN, SiON, SiC, SiCN, SiCO, or SiCON. The second barrier layer 1702 may have a thickness of, for example, about 30 to about 60 angstroms. In the embodiment, the second barrier layer 1702 is formed in contact with the high-k dielectric layer 1502, the work function metal layer 1504, the metal gate 1508 and the bottom isolation layer 302; in some embodiment, there are other layers therebetween so that the second barrier layer 1702 is formed not in contact with but adjacent to them.

A second interlayer dielectric 1704 (e.g., an oxide layer) is formed over the second barrier layer 1702. To enhance quality of the second interlayer dielectric 1704, oxidation processes may be applied to the second interlayer dielectric 1704. In some embodiments, the enhancement is included in the formation of the second interlayer dielectric 1704. The high-k dielectric layer 1502, the work function metal layer 1504, and the metal gate 1508 are covered by the second barrier layer 1702 so that the oxidation processes for the enhancement does not damage or oxidize the first vertical structure 110. The protection that the second barrier layer 1702 provides is not limited to the above oxidation and can be any that is likely to oxidize the first vertical structure 110.

Figure 18:
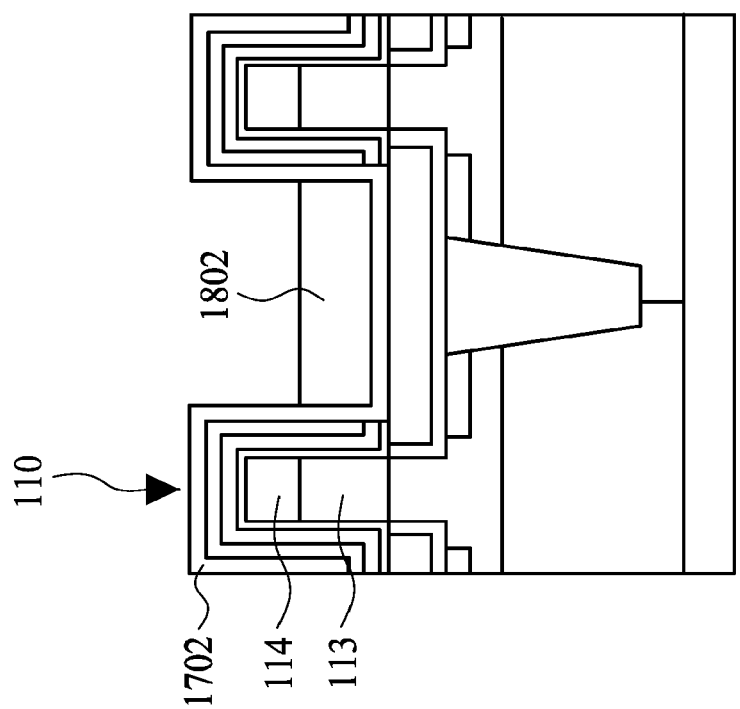

FIG. 18 is a sectional view illustrating the exemplary semiconductor device in accordance with some embodiments. As shown in FIG. 18, a chemical mechanical polishing is performed on the second interlayer dielectric 1704 and stops on the second barrier layer 1702. Moreover, the second interlayer dielectric 1704 is etched back as a middle isolation layer 1802 to be aligned with a top of the channel 113 in conjunction with the drain 114.

Figure 19:
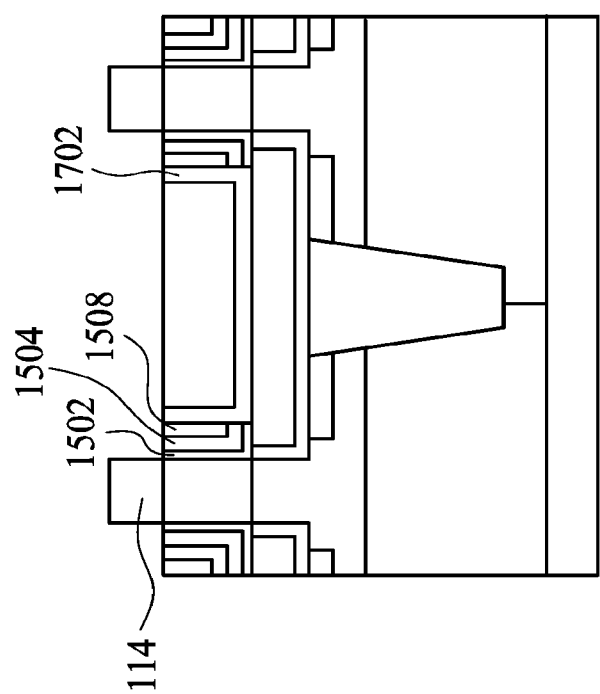

FIG. 19 is a sectional view illustrating the exemplary semiconductor device in accordance with some embodiments. As shown in FIG. 19, the second barrier layer 1702, the high-k dielectric layer 1502, the work function metal layer 1504, and the metal gate 1508 are etched back to disconnect from the drain 114.

Figure 20:
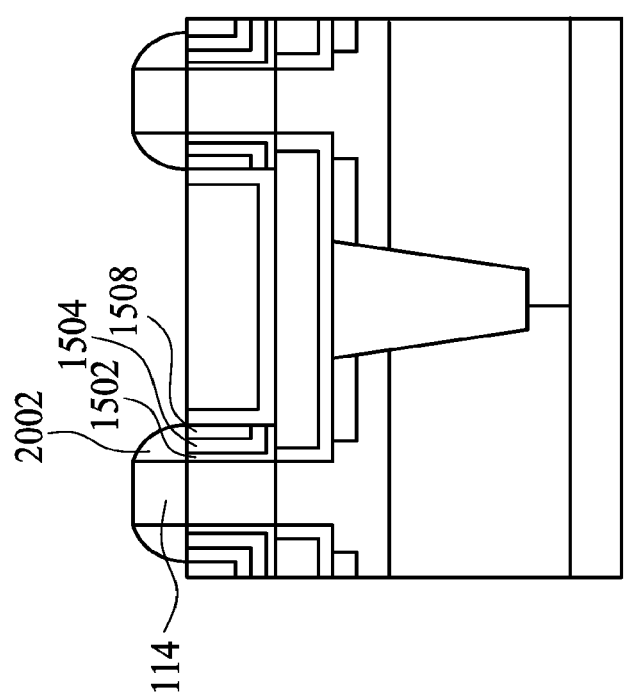

FIG. 20 is a sectional view illustrating the exemplary semiconductor device in accordance with some embodiments. As shown in FIG. 20, a third barrier layer 2002 is formed over the high-k dielectric layer 1502, the work function metal layer 1504, the metal gate 1508, and a sidewall of the drain 114 so as to protect them from oxidation. The third barrier layer 2002 may be formed of SiN, SiON, SiC, SiCN, SiCO, or SiCON. The formation of the third barrier layer 2002 may include: to conformally form the third barrier layer 2002; and to perform dry etching on the third barrier layer 2002 to expose the drain 114. In the embodiment, the third barrier layer 2002 is formed in contact with the high-k dielectric layer 1502, the work function metal layer 1504, the metal gate 1508, and a sidewall of the drain 114; in some embodiment, there are other layers therebetween so that the third barrier layer 2002 is formed not in contact with but adjacent to them.

Figure 21:
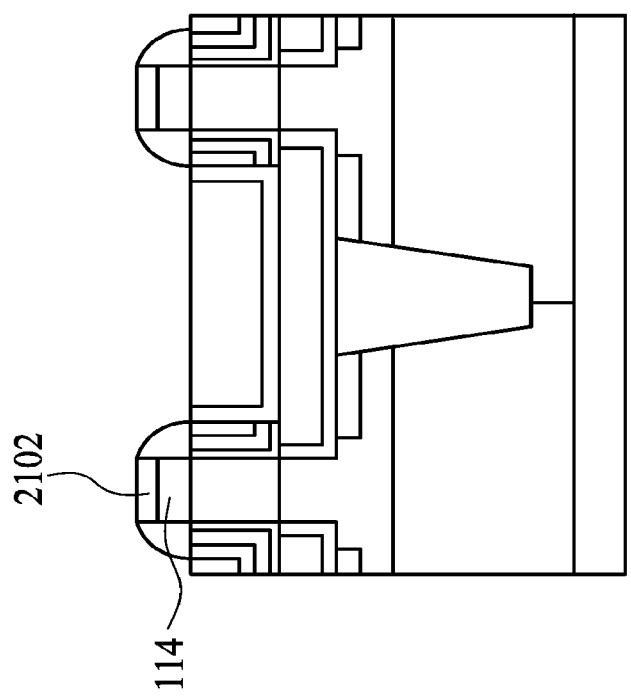

FIG. 21 is a sectional view illustrating the exemplary semiconductor device in accordance with some embodiments. As shown in FIG. 21, a metal is deposited on the drain 114, and annealing is performed on the metal to form a silicide 2102.

Figure 22:
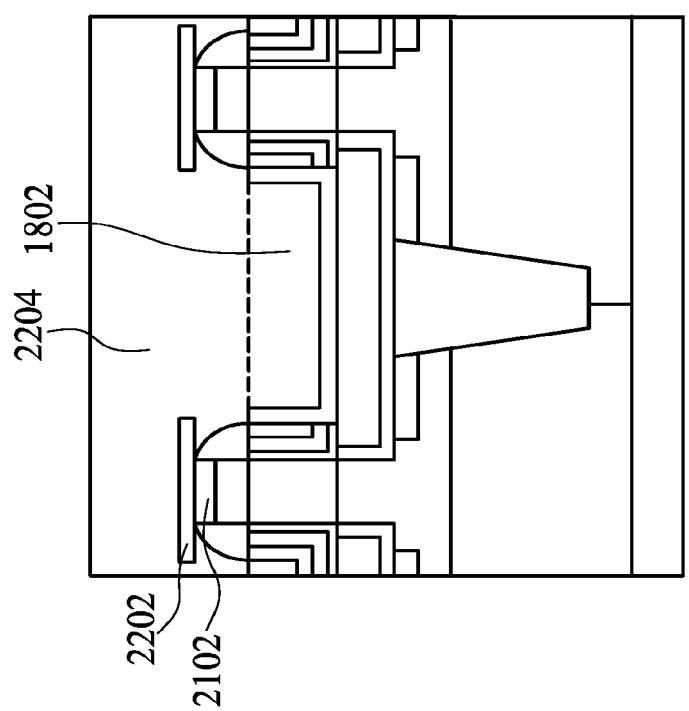

FIG. 22 is a sectional view illustrating the exemplary semiconductor device in accordance with some embodiments. As shown in FIG. 22, a pad 2202 is formed on the silicide 2102. A third interlayer dielectric 2204 (e.g., an oxide layer) is formed over the middle isolation layer 1802 and the pad 2202 as a top isolation layer.

Figure 23:
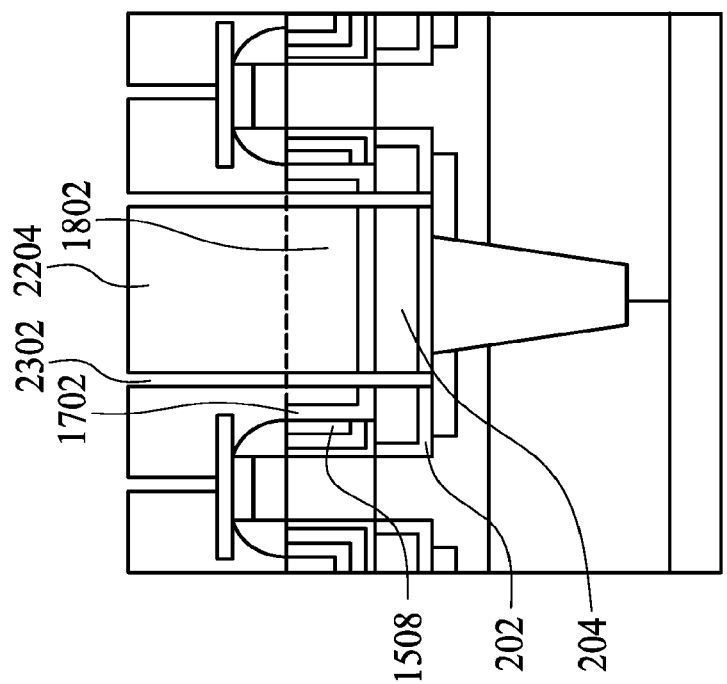

FIG. 23 is a sectional view illustrating the exemplary semiconductor device in accordance with some embodiments. As shown in FIG. 23, an opening 2302 is formed through the first barrier layer 202, the first interlayer dielectric 204, the second barrier layer 1702, the second interlayer dielectric 1802, and the third interlayer dielectric 2204. The formation of the opening 1302 may include: to etch the third interlayer dielectric 2204 and the second interlayer dielectric 1802; to etch the second barrier layer 1702; to etch the first interlayer dielectric 204; to etch the first barrier layer 202. In some embodiments, when the metal gate 1508 is closer to the opening 2302, the second barrier layers 1702 can be used a hard mask during such formation of the opening 2302 to protect the metal gate 1508 from unexpected damage.

Figure 24:
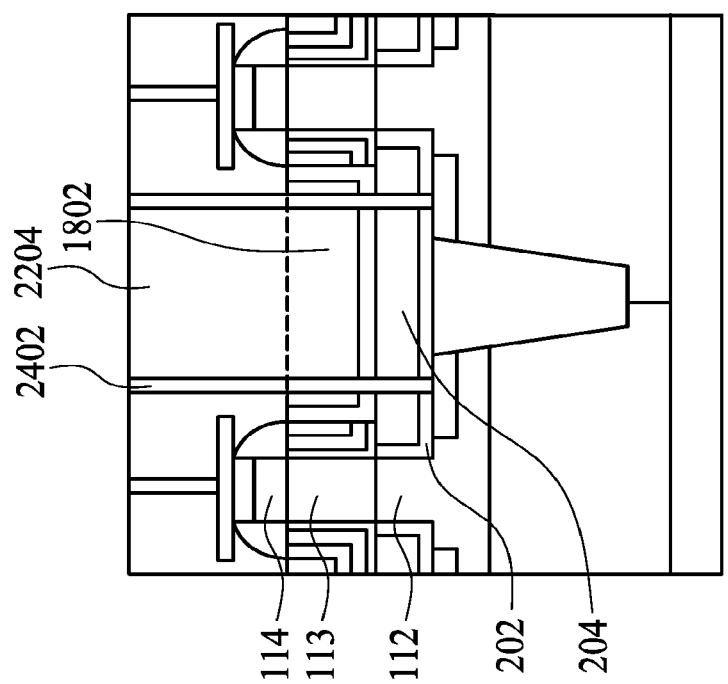

FIG. 24 is a sectional view illustrating the exemplary semiconductor device in accordance with some embodiments. As shown in FIG. 24, a contact metal 2402 is formed in the opening 2302. A chemical mechanical polishing is performed on the contact metal 2402 and stops on the third interlayer dielectric 2204.

In the abovementioned processes, the first barrier layer 202 protects the source 112, the channel 113, and the drain 114 of the first vertical structure 110 from the formation of the bottom isolation layer 302 which may damage or oxidize the first vertical structure 110. The second barrier layer 1702 protects the high-k dielectric layer 1502, the work function metal layer 1504, and the metal gate 1508 from the formation of the middle isolation layer 1802 which may damage or oxidize the first vertical structure 110. The third barrier layer 2002 protects the high-k dielectric layer 1502, the work function metal layer 1504, the metal gate 1508, and the drain 114 from the formation of the top isolation layer 2204 which may damage or oxidize the first vertical structure 110. Each of the formation of the bottom isolation layer 302, the middle isolation layer 1802, and the top isolation layer 2204 respectively corresponds to the source 112, the gate in contact with the channel 113, and the drain 114.

Figure 25:
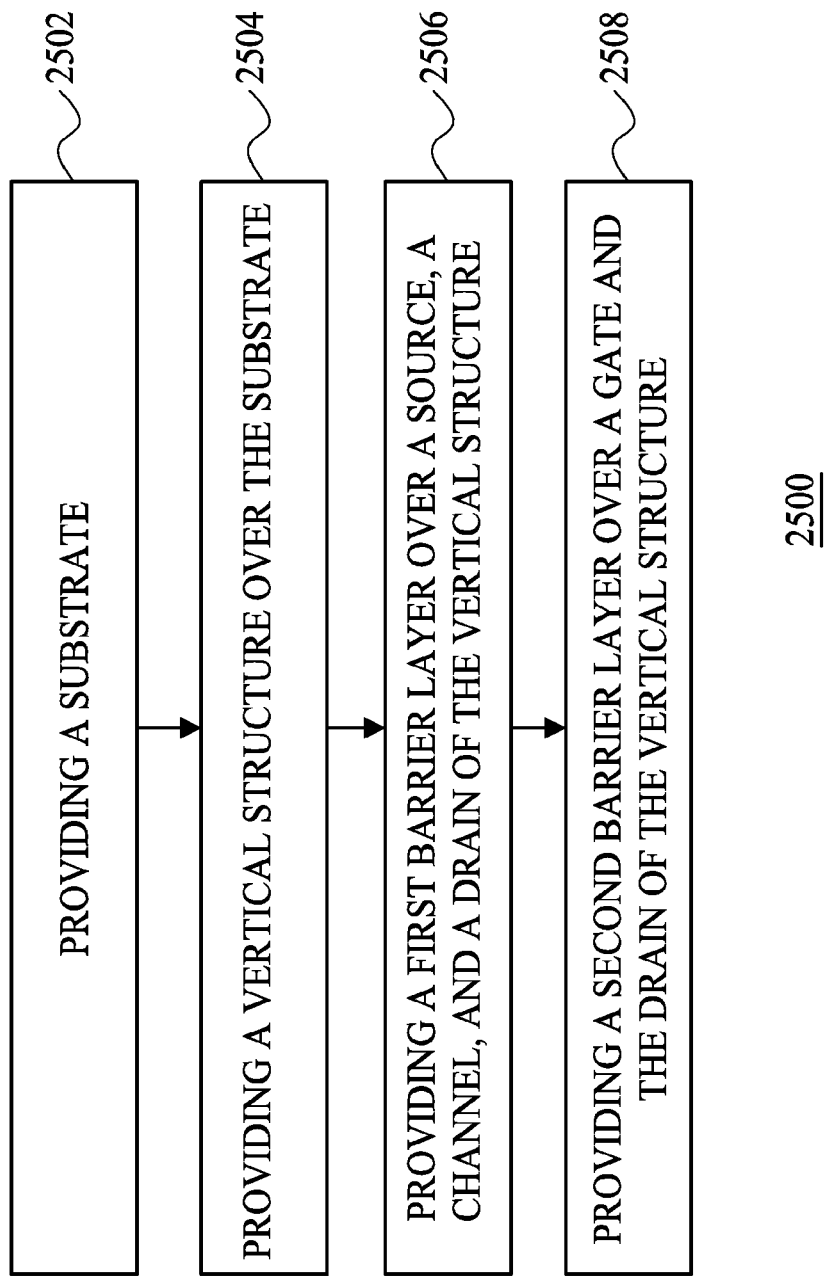
FIG. 25 is a flow chart for a method forming a vertical structure in accordance with some embodiments.

FIG. 25 is a flow chart for a method of forming a vertical structure with at least two barrier layers. As shown in FIG. 25, a method 2500 is provided. The method 2500 includes the following operations: providing a substrate (2502); providing a vertical structure over the substrate (2504); providing a first barrier layer over a source, a channel, and a drain of the vertical structure (2506); and providing a second barrier layer over a gate and the drain of the vertical structure (2508).

The method 2500 may further include forming a first interlayer dielectric over the first barrier layer corresponding to the source of the vertical structure. The method 2500 may further include forming the gate over the channel of the vertical structure. The method 2500 may further include forming a second interlayer dielectric over the second barrier layer corresponding to the gate and the drain of the vertical structure. The method 2500 may further include: performing chemical mechanical polishing on the second interlayer dielectric and stopping on the second barrier layer; etching the second interlayer dielectric and the second barrier layer to expose a top of the drain; and forming silicide on the drain.

The method 2500 may further include: forming an opening through the first barrier layer, the first interlayer dielectric, the second barrier layer, and the second interlayer dielectric; and forming contact metal in the opening. The method 2500 may further include etching the second barrier layer to expose the drain and a top of the gate; and forming a third barrier layer as a spacer over the top of the gate and a sidewall of the drain. The operation 2508 may further include providing the second barrier layer in contact with a sidewall of the drain of the vertical structure. The operation 2508 may further include providing the second barrier layer in contact with a sidewall of the drain and a top and a sidewall of the gate of the vertical structure.

Figure 26:
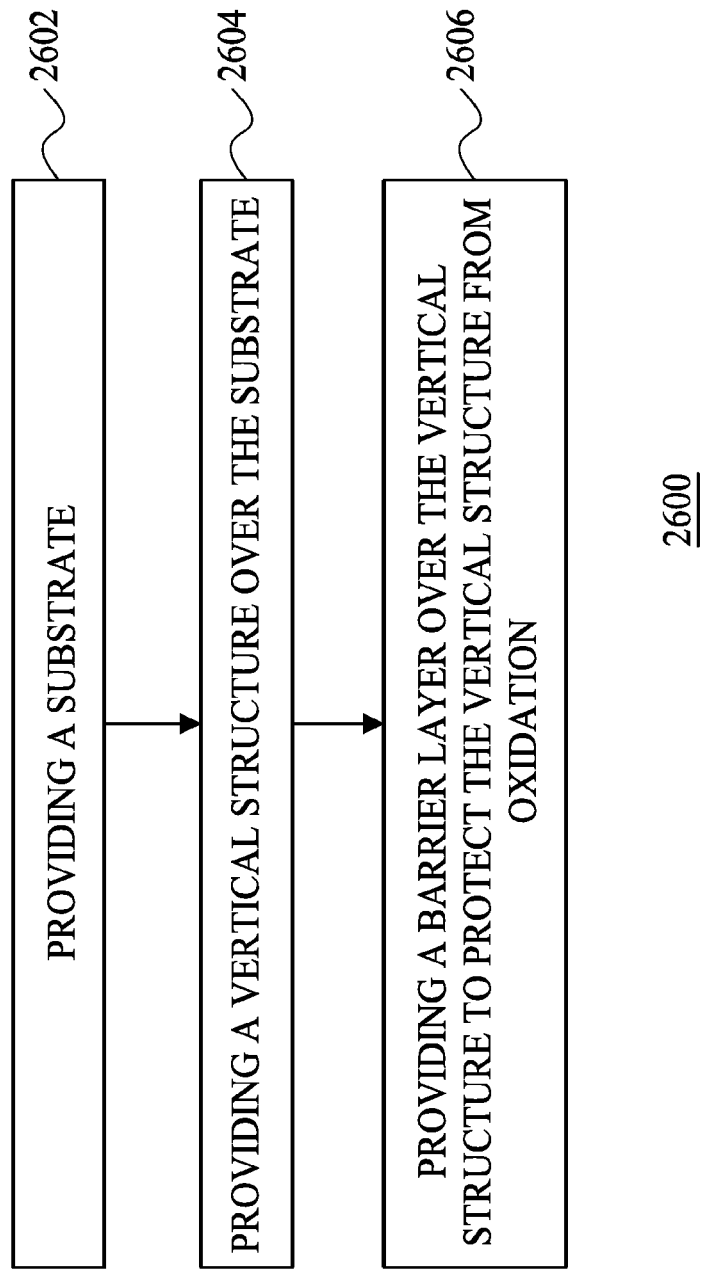
FIG. 26 is a flow chart for a method forming a vertical structure in accordance with some embodiments.

FIG. 26 is a flow chart for a method of forming a vertical structure. As shown in FIG. 26, a method 2600 is provided. The method 2600 includes the following operations: providing a substrate (2602); providing a vertical structure over the substrate (2604); and providing a barrier layer over the vertical structure to protect the vertical structure from oxidation (2606).

The operation 2606 may further include providing the barrier layer over the vertical structure to protect the vertical structure from oxidation during formation of an oxide layer. The operation 2606 may further include providing the barrier layer over a source of the vertical structure to protect the source during formation of the oxide layer corresponding to the source. The operation 2606 may further include providing the barrier layer over a gate of the vertical structure to protect the gate during formation of the oxide layer corresponding to the gate. The operation 2606 may further include providing the barrier layer over a drain of the vertical structure to protect the drain during formation of the oxide layer corresponding to the drain.

According to an exemplary embodiment, a method of forming a vertical structure with at least two barrier layers is provided. The method includes the following operations: providing a substrate; providing a vertical structure over the substrate; providing a first barrier layer over a source, a channel, and a drain of the vertical structure; and providing a second barrier layer over a gate and the drain of the vertical structure.

According to an exemplary embodiment, a method of forming a vertical structure is provided. The method includes the following operations: providing a substrate; providing a vertical structure over the substrate; and providing a barrier layer over the vertical structure to protect the vertical structure from oxidation.

According to an exemplary embodiment, a semiconductor device is provided. The device includes: a substrate; a vertical device over the substrate and having a source, a gate and a drain; and a barrier layer over the gate and the drain of the vertical structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
forming a vertical structure including a first source/drain region, a channel region over the first source/drain region and a second source/drain region over the channel region;
forming a first barrier layer over the vertical structure;
forming an interlayer dielectric layer over the first barrier layer;
exposing the channel region and the second source/drain region;
forming a gate structure over the exposed channel region; and
forming a second barrier layer, which is separated from the first barrier layer, over the gate structure.

2. The method of claim 1, wherein after the second barrier layer is formed, the first barrier layer has a top surface lower than a top of the channel region.

3. The method of claim 2, wherein after the second barrier layer is formed, the first barrier layer has an L-shape in a cross section having a vertical portion disposed on a side face of the first source/drain region and a horizontal portion horizontally extending from a bottom of the vertical portion.

4. The method of claim 2, wherein the exposing the channel region and the second source/drain region includes:
recessing the first interlayer dielectric layer to exposed the first barrier layer disposed over the channel region and the second source/drain region; and
removing the first barrier layer, thereby exposing the channel region and the second source/drain region.

5. The method of claim 4, wherein the forming the gate structure includes:
forming a gate dielectric layer over the channel region and the second source/drain region;
forming one or more conductive layers over the gate dielectric layer; and
removing the one or more conductive layer and the gate dielectric layer from the second source/drain region, thereby exposing the second source/drain region.

6. The method of claim 5, wherein the gate dielectric layer is formed on the recessed first insulating layer and the top surface of the first barrier layer.

7. The method of claim 5, wherein the second barrier layer is directly formed on the exposed second source/drain region.

8. The method of claim 5, wherein the second barrier layer is formed on the exposed second source/drain region with one or more layers being interposed.

9. The method of claim 5, wherein the second barrier layer is formed on the recessed first insulating layer.

10. The method of claim 5, wherein the second barrier layer is in contact with a top of the gate dielectric layer and a top or tops of the one or more conductive layers.

11. The method of claim 5, further comprising removing a part of the second barrier layer formed on a top of the second source/drain region.

12. The method of claim 11, further comprising forming a silicide layer over the top of the second source/drain region.

13. The method of claim 12, wherein the silicide layer is in contact with a top of the second barrier layer.

14. The method of claim 4, wherein the first barrier layer is removed such that a part of the first barrier layer disposed on a bottom part of the channel region remains.

15. The method of claim 4, wherein when removing the first barrier layer, a part of the first source/drain region is exposed.

16. A method of manufacturing a semiconductor device, the method comprising:
forming a first vertical structure and a second vertical structure over a substrate, each including a first source/drain region, a channel region over the first source/drain region and a second source/drain region over the channel region;
forming a first barrier layer over the first and second vertical structures;
forming an interlayer dielectric layer over the first barrier layer;
exposing the channel region and the second source/drain region of each of the first and second vertical structures;
forming a gate dielectric layer over the exposed channel region of each of the first and second vertical structures;
forming at least two layers of work function adjustment materials on the gate dielectric layer over the first vertical structure, and forming at least one layer of work function adjustment material on the gate dielectric layer over the second vertical structure;
forming a gate metal over the first and second vertical structures;
removing part of the gate metal, part of the two layers of work function adjustment materials and part of the one layer of work function adjustment material, thereby exposing the second source/drain region of each of the first and second vertical structures; and
forming a second barrier layer, which is separated from the first barrier layer, over the exposed second source/drain region of each of the first and second vertical structures.

17. The method of claim 16, wherein after the second barrier layer is formed, the first barrier layer has a top surface lower than a top of the channel region of each of the first and second vertical structures.

18. A method of manufacturing a semiconductor device, the method comprising:
forming a vertical structure including a first source/drain region, a channel region over the first source/drain region and a second source/drain region over the channel region;
forming a first barrier layer over the vertical structure;
forming an interlayer dielectric layer over the first barrier layer;
exposing the channel region and the second source/drain region;
forming gate layers over the exposed channel region and the exposed second source/drain region;
forming a second barrier layer, which is separated from the first barrier layer, over the gate layers;
removing part of the gate layers and part of the second barrier layer, thereby exposing the second source/drain region; and
forming a third barrier layer on sidewalls of the exposed second source/drain region.

19. The method of claim 18, wherein after the second barrier layer is formed, the first barrier layer has a top surface lower than a top of the channel region.

20. The method of claim 18, wherein after the third barrier layer is formed, the second barrier layer has a top surface lower than a top of the second source/drain region.

\* \* \* \* \*